(12) United States Patent
Sorenson et al.

(10) Patent No.: US 9,949,377 B2
(45) Date of Patent: Apr. 17, 2018

(54) ELECTRONIC DEVICES WITH INTERNAL MOISTURE-RESISTANT COATINGS

(71) Applicant: HZO, INC., Draper, UT (US)

(72) Inventors: Max Sorenson, Cottonwood Heights, UT (US); Blake Stevens, Morristown, NJ (US); Alan Rae, Wilson, NY (US); Marc Chason, Schaumburg, IL (US)

(73) Assignee: HZO, INC., Draper, UT (US)

( * ) Notice: Subject to any disclaimer, the term of this patent is extended or adjusted under 35 U.S.C. 154(b) by 0 days.

(21) Appl. No.: 14/593,614

(22) Filed: Jan. 9, 2015

(65) Prior Publication Data

US 2015/0146396 A1 May 28, 2015

Related U.S. Application Data

(63) Continuation of application No. 13/735,862, filed on Jan. 7, 2013, now abandoned.

(60) Provisional application No. 61/584,929, filed on Jan. 10, 2012.

(51) Int. Cl.
| | |
|---|---|
| *H05K 1/16* | (2006.01) |
| *H05K 3/28* | (2006.01) |
| *H05K 1/18* | (2006.01) |
| *H05K 13/00* | (2006.01) |

(52) U.S. Cl.
CPC ............ *H05K 3/284* (2013.01); *H05K 1/185* (2013.01); *H05K 13/00* (2013.01); *H05K 13/0023* (2013.01); *H01L 2224/16225* (2013.01); *H05K 2201/09872* (2013.01); *Y10T 29/49002* (2015.01); *Y10T 29/49117* (2015.01)

(58) Field of Classification Search
CPC ....................... H01R 13/5219; H05K 3/284

USPC ..... 174/350–357; 29/830–846; 361/760–768
See application file for complete search history.

(56) References Cited

U.S. PATENT DOCUMENTS

| | | | |
|---|---|---|---|
| 5,232,758 A | * | 8/1993 | Juskey et al. ................... 428/76 |
| 5,394,304 A | * | 2/1995 | Jones ....................... B65B 53/02 |
| | | | 174/256 |
| 5,438,480 A | | 8/1995 | Yamashita |

(Continued)

FOREIGN PATENT DOCUMENTS

| | | |
|---|---|---|
| CN | 1494132 A | 5/2004 |
| CN | 1661775 A | 8/2005 |

(Continued)

OTHER PUBLICATIONS

Taiwan Intellectual Property Office, "Search Report of Patent Application No. 101117535," dated May 8, 2014.

(Continued)

*Primary Examiner* — Tuan T Dinh
(74) *Attorney, Agent, or Firm* — Kunzler, PC

(57) ABSTRACT

A moisture-resistant electronic device includes at least one electronic component at least partially covered by a moisture-resistant coating. The moisture-resistant coating may be located within an interior of the electronic device. The moisture-resistant coating may cover only portions of a boundary of an internal space within the electronic device. A moisture-resistant coating may include one or more discernible boundaries, or seams, which may be located at or adjacent to locations where two or more components of the electronic device interface with each other. Assembly methods are also disclosed.

3 Claims, 2 Drawing Sheets

(56) References Cited

U.S. PATENT DOCUMENTS

| | | | |
|---|---|---|---|
| 5,461,545 A * | 10/1995 | Leroy | H05K 3/284 |
| | | | 174/17.05 |
| 5,557,064 A * | 9/1996 | Isern-Flecha et al. | 174/393 |
| 5,639,989 A * | 6/1997 | Higgins, III | H01L 23/552 |
| | | | 174/386 |
| 6,219,258 B1 * | 4/2001 | Denzene | H01R 13/5219 |
| | | | 174/358 |
| 6,380,487 B1 | 4/2002 | Hollenbeck et al. | |
| 6,492,194 B1 * | 12/2002 | Bureau et al. | 438/106 |
| 6,768,654 B2 * | 7/2004 | Arnold | B29C 45/14811 |
| | | | 174/394 |
| 6,900,383 B2 * | 5/2005 | Babb | H01L 23/552 |
| | | | 174/394 |
| 7,161,092 B2 * | 1/2007 | Glovatsky | H05K 3/284 |
| | | | 174/522 |
| 7,196,275 B2 * | 3/2007 | Babb et al. | 174/382 |
| 7,329,608 B2 | 2/2008 | Babayan et al. | |
| 7,752,751 B2 * | 7/2010 | Kapusta et al. | 29/852 |
| 7,851,271 B2 | 12/2010 | Kamo et al. | |
| 8,053,171 B2 | 11/2011 | Maekawa et al. | |
| 8,367,209 B2 | 2/2013 | Zhang et al. | |
| 8,735,483 B2 | 5/2014 | Muro et al. | |
| 2005/0158665 A1 | 7/2005 | Maekawa et al. | |
| 2006/0152913 A1 * | 7/2006 | Richey et al. | 361/818 |
| 2007/0003763 A1 | 1/2007 | Kamo et al. | |
| 2009/0263581 A1 | 10/2009 | Martin, III et al. | |
| 2009/0263641 A1 | 10/2009 | Martin, III et al. | |
| 2009/0304549 A1 | 12/2009 | Coulson | |
| 2010/0011853 A1 | 1/2010 | Anthony et al. | |
| 2010/0203347 A1 | 8/2010 | Coulson | |
| 2010/0293812 A1 | 11/2010 | Coulson | |
| 2011/0253429 A1 | 10/2011 | Humphries et al. | |
| 2011/0262740 A1 | 10/2011 | Martin, III et al. | |
| 2011/0281393 A1 | 11/2011 | He et al. | |
| 2012/0125431 A1 | 5/2012 | Oizumi et al. | |
| 2013/0165593 A1 | 6/2013 | Ichiryu et al. | |

FOREIGN PATENT DOCUMENTS

| | | |
|---|---|---|
| CN | 102150480 A | 8/2011 |
| JP | SHO 63-284889 | 11/1988 |
| JP | 04-053245 | 2/1992 |
| JP | 04-184831 | 7/1992 |
| JP | 05-101886 | 4/1993 |
| JP | 06-53681 | 2/1994 |
| JP | 6-44178 | 6/1994 |
| JP | 06-334358 | 12/1994 |
| JP | H09307243 | 11/1997 |
| JP | 2003-179174 A | 6/2003 |
| JP | 2004-092598 | 3/2004 |
| JP | 2011-239139 | 11/2011 |
| JP | 2013-527973 | 7/2013 |
| KR | 10-04618440000 | 12/2004 |
| TW | 200815574 A | 4/2008 |
| TW | 201115804 A1 | 5/2011 |
| TW | 201205190 A1 | 2/2012 |
| TW | 201211085 A1 | 3/2012 |
| TW | 201218475 A1 | 5/2012 |
| WO | 2006/100768 A1 | 9/2006 |
| WO | 2009/084635 A1 | 7/2009 |
| WO | 2011/104500 A1 | 9/2011 |

OTHER PUBLICATIONS

United States Patent and Trademark Office as the International Searching Authority, "International Search Report and Written Opinion," dated Mar. 7, 2013, in related PCT application No. PCT/US2013/020510.

* cited by examiner

ELECTRONIC DEVICES WITH INTERNAL MOISTURE-RESISTANT COATINGS

CROSS-REFERENCE TO RELATED APPLICATION

This application is a continuation of, and claims the benefit of priority under 35 U.S.C. § 120 to, U.S. patent application Ser. No. 13/735,862, filed on Jan. 7, 2013 and titled ELECTRONIC DEVICES WITH INTERNAL MOISTURE RESISTANT COATINGS ("the '862 Application"), which claims the benefit of priority under 35 U.S.C. § 119(e) to U.S. Provisional Patent Application No. 61/584,929, filed on Jan. 10, 2012 and titled ELECTRONIC DEVICES WITH INTERNAL WATER-RESISTANT COATINGS ("the '929 Provisional Application"). The entire disclosures of the '929 Provisional Application and '862 Application are hereby incorporated herein.

BACKGROUND

Technical Field

This disclosure relates generally to electronic devices and, more specifically, to electronic devices with protective coatings. In some embodiments, the protective coatings may comprise coatings that are resistant to moisture, including liquids and vapors of a variety of materials, such as water, aqueous solutions and organic materials. In particular, this disclosure relates to electronic devices with internal protective coatings, including protective coatings on exterior surfaces of internally located electronic components.

SUMMARY

An electronic device according to this disclosure includes at least one electronic component at least partially covered by a protective coating. The protective coating may comprise a coating that may protect an electronic device, its components or their features from potentially damaging conditions, including, but not limited to, exposure to moisture. This disclosure, in describing protective coatings, electronic devices that include protective coatings, and processes for applying protective coatings and assembling electronic devices, refers primarily to "moisture-resistant" coatings. The teachings of this disclosure are, however, also applicable to other types of protective coatings that may be useful on or in electronic devices.

The term "moisture-resistant" is used throughout this disclosure to refer to the ability of a coating to prevent exposure of a coated element or feature to moisture. A moisture-resistant coating may resist wetting or penetration by one or more types of moisture, or it may be impermeable or substantially impermeable to one or more types of moisture. A moisture-resistant coating may repel one or more types of moisture. In some embodiments, a moisture-resistant coating may be impermeable to, substantially impermeable to or repel water, an aqueous solution (e.g., salt solutions, acidic solutions, basic solutions, drinks, etc.) or vapors of water or other aqueous materials (e.g., humidity, fogs, mists, etc.). Use of the term "moisture-resistant" to modify the term "coating" should not be considered to limit the scope of materials against which the coating protects one or more components of an electronic device. The term "moisture-resistant" may also refer to the ability of a coating to restrict permeation of or repel organic liquids or vapors (e.g., organic solvents, low molecular weight organic materials, electrically conductive organic materials, etc.), as well as a variety of other substances or conditions that might pose a threat to an electronic device or its components.

The moisture-resistant coating may be located at least partially within an interior of the electronic device, on a surface of an electronic component that resides within or is otherwise exposed to (e.g., defines a boundary of, etc.) the interior of the electronic device. Accordingly, for purposes of this disclosure, a portion of the moisture-resistant coating that is exposed to (e.g., resides within, defines a boundary of, etc.) an interior of an electronic device is said to be "internally confined." In some embodiments, all of the moisture-resistant coatings of an electronic device assembled in accordance with teachings of this disclosure may be internally confined. Stated another way, all of the moisture-resistant coatings of an electronic device may consist of moisture-resistant coatings that are internally confined within the electronic device.

An internally confined moisture-resistant coating may be positioned and/or configured to limit the exposure of one or more features of an electronic device to undesirable conditions. The moisture-resistant coating may comprise a conformal coating, with no gaps or substantially no gaps existing between the moisture-resistant coating and the surface(s) that the moisture-resistant coating covers. In some implementations, a moisture-resistant coating may cover electrically conductive features (e.g., intermediate conductive elements, such as leads, solder bonds and the like; terminals and exposed conductive traces on a circuit board; etc.), preventing their exposure to moisture and, thus, making them less likely to participate in electrical shorting that might otherwise be caused as moisture (e.g., water, an aqueous solution, water vapor, vapor of an aqueous solution, an electrically conductive organic liquid, etc.) within the interior of the electronic device extends between two or more electrically conductive elements. In addition, the water-resistant coating may prevent or eliminate corrosion that might otherwise detrimentally affect the performance of various features of the electronic device (e.g., electrically conductive features, moving features, etc.).

In a specific embodiment, a moisture-resistant coating may cover electrically conductive features that are exposed on the surface of a circuit board. Without limitation, the electrically conductive features of a circuit board that may be covered with a moisture-resistant coating include various conductive elements of the circuit board, including conductive traces, conductive vias, leads, terminals and other conductive pads.

In another specific embodiment, a moisture-resistant coating may cover an intermediate conductive element (e.g., a lead, a solder ball, etc.) and portions of components (e.g., a circuit board, a semiconductor device, an electronic part, etc.) that are adjacent to the ends of the intermediate conductive element to prevent exposure of those components to moisture and, thus, to protect those components from the various types of damage that may be caused by moisture. Since these elements may include features that are located at different elevations from one another, a moisture-resistant coating that at least partially covers these elements may include portions located at a plurality of different elevations. On a larger scale, and without limitation, a moisture-resistant coating may at least partially cover a plurality of assembled electronic components (e.g., semiconductor devices; discrete components, such as resistors, capacitors, inductors, diodes and the like; etc.) and intermediate conductive elements (e.g., leads, solder balls, etc.) extending from the electronic components and adjacent portions of a circuit board. Providing a moisture-resistant coating over the entire intermediate conductive element and portions of the structures located adjacent to ends of the intermediate conductive element prevents moisture (e.g., water, an aqueous solution, water vapor, vapor of an aqueous solution, etc.) from contacting the intermediate conductive element. Limiting exposure of the intermediate conductive element to moisture reduces the likelihood that the intermediate conductive element will participate in electrical shorting that might otherwise be caused by the moisture, as well as the likelihood that various features of the electronic device (e.g., electrical features, moving parts, etc.) will corrode.

An electronic device may include a moisture-resistant coating over at least one pair of complementary electrical connectors that have been assembled with one another, or that engage each other. When applied to a pair of complementary, engaged electrical connectors, a moisture-resistant coating may prevent the introduction of moisture (e.g., water, an aqueous solution, water vapor, vapor of an aqueous solution, electrically conductive organic liquid, etc.) into a junction between the engaged electrical connectors and, thus, limit the exposure of contacts of the electrical connectors to moisture.

In some embodiments, combinations of features, and even combinations of electrically coupled assemblies may be coated.

A particular embodiment of an electronic device includes at least one component of a wireless power system (e.g., a receiver of an inductive charger, etc.). At least one internally confined surface of such a component, and, optionally, electrical connections to and/or from such a component, may be at least partially covered with a moisture-resistant coating. In some embodiments, such an electronic device may lack externally accessible contacts for physically coupling with cables or other wires.

A moisture-resistant coating within an electronic device may coat some interior components, or even portions of some interior components, without coating surfaces of other components. Some surfaces that are exposed to a particular internal space within an electronic device may be covered with a moisture-resistant coating while other surfaces exposed to the same internal space remain uncoated, or they may be exposed laterally beyond a periphery of the moisture-resistant coating. Thus, one or more moisture-resistant coatings may be selectively applied to components or portions of components within the interior of an electronic device. In some embodiments, such selectivity may be achieved by actively directing material toward selected regions of an electronic device assembly or its components or by passively applying a moisture-resistant coating to an entire surface of the electronic device assembly, then removing portions of the moisture-resistant coating from selected regions of electronic device assembly.

An electronic device may include a plurality of different types of moisture-resistant coatings. In such embodiments, the different moisture-resistant coatings may have one or more properties or characteristics that differ from one another. These may include, but are not limited to, physical features (e.g., dimensions, textures, etc.), chemical characteristics (e.g., different materials may be used to form different moisture-resistant coatings, etc.), or other characteristics (e.g., transparency/opacity, thermal conductivity, etc.), which may or may not be defined by some other property of the moisture-resistant coating.

Of course, methods for applying moisture-resistant coatings to electronic devices and assembling electronic devices that include one or more moisture-resistant coatings on components or features thereof are also within the scope of the disclosed subject matter. Such a method may include applying a first coating to at least a portion of a surface of a first component (which may comprise a subassembly) or feature of an electronic device, applying a second coating to at least a portion of a surface of a second component (which may comprise a subassembly) or feature of the electronic device, and after the first and second coatings have been applied, assembling the first component and the second component. When such a method is used, discernible boundaries, or seams, may be present between the moisture-resistant coatings on adjacent assembled components; for example, at an interface between the assembled components.

Other aspects, as well as features and advantages of various aspects, of the disclosed subject matter will become apparent to those of skill in the art through consideration of the ensuing description, the accompanying drawings and the appended claims.

DETAILED DESCRIPTION

Figure 1:
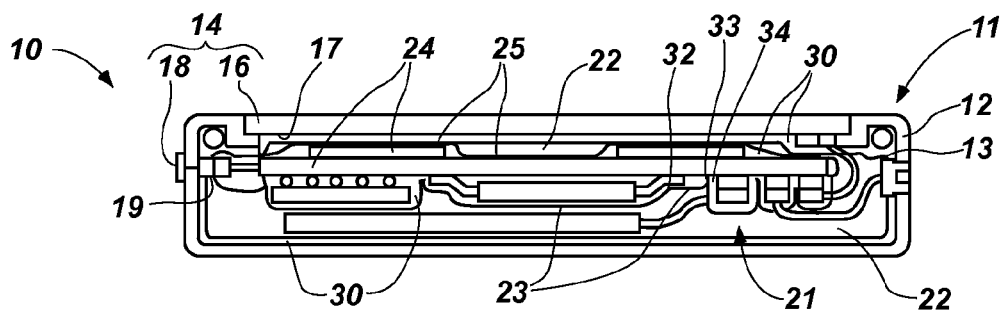
FIG. 1 is a schematic representation of an embodiment of an electronic device that includes at least one internal moisture-resistant coating.

FIG. 1 provides a schematic representation of an electronic device 10 with a housing 12 and other external components 14, such as the display 16 and various other user interface components 18 (e.g., speakers, microphones, headphone jacks, communication ports, buttons, etc.) that are shown in FIG. 1. The housing 12 defines at least a portion of an exterior 11 of the electronic device 10. Externally accessible portions of external components 14 may also define part of the exterior 11 of the electronic device 10.

Within an interior 21 of the electronic device 10 are various internal components 24, as well as internally located (relative to the exterior 11 of the electronic device 10) surfaces 17, 19 of components that are also exposed to the exterior 11 of the electronic device 10 (e.g., of the display 16 and other user interface components 18, respectively). The interior 21 of an electronic device 10 may include one or more internal spaces 22. The boundaries 23 of each internal space 22 may be defined by surfaces 25 of one or more internal components 24 and, optionally, by internally located surfaces 17 of the display 16, the internally located surfaces 19 of one or more other user interface components 18 and/or internal surfaces 13 of one or more elements of the housing 12.

At least one moisture-resistant coating 30 may reside within the interior 21 of the electronic device 10. One or more moisture-resistant coatings 30 may line at least portions of the boundaries of at least one internal space 22 within the electronic device 10. Thus, a moisture-resistant coating 30 may reside on the surface 25 of one or more of the internal components 24 of the electronic device 10, on the internally located surface 17 of the display 16, on the internally located surface 19 of at least one other user interface component 18 and/or on one or more internal surfaces 13 of at least one element of the housing 12.

FIG. 1 illustrates an embodiment of electronic device 10 in which a moisture-resistant coating 30 covers all of the surfaces that define the boundaries 23 of an internal space 22. In embodiments where the boundaries 23 of the internal space 22 are defined by surfaces of a plurality of different components (which may also comprise subassemblies), the moisture-resistant coating 30 may include a plurality of different sections 32 and 34 formed prior to assembling the components with one another. Thus, a discernible boundary 33, or seam, may exist between different sections 32 and 34 of the moisture-resistant coating 30, at or adjacent to an interface between the assembled components.

Figure 2:
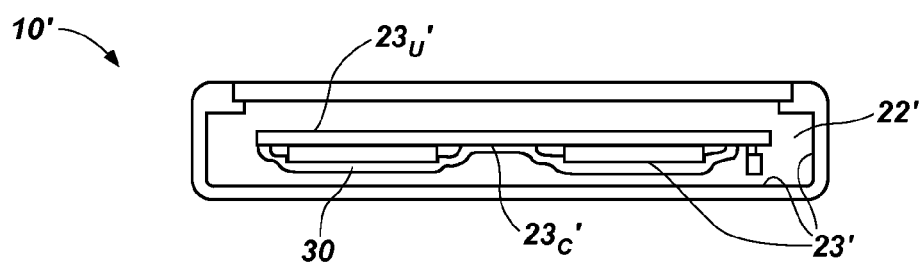
FIGS. 2 through 4 illustrate different embodiments of the manner in which one or more moisture-resistant coatings may cover surfaces within the interior of an electronic device.

Alternatively, as depicted by FIG. 2, an electronic device 10' may include at least one internal space 22' in which only some portions $23_C'$ of the surfaces that define its boundaries 23' may be lined with a moisture-resistant coating 30, while other portions $23_U'$ of the surfaces that define the boundaries 23' may remain uncoated.

Figure 3:
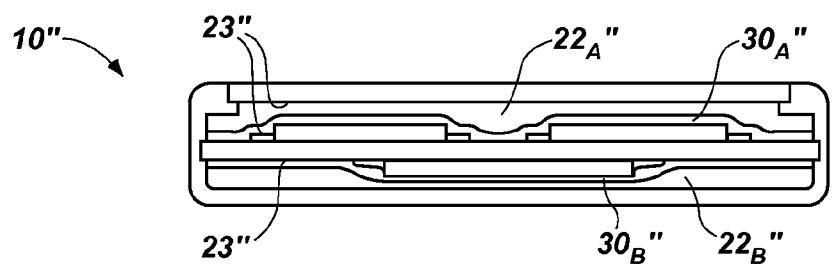

Referring now to FIG. 3, another embodiment of electronic device 10" includes different internal spaces $22_A"$ and $22_B"$ that are lined with moisture-resistant coatings $30_A"$ and $30_B"$, respectively, which have different characteristics from one another. In some embodiments, the moisture-resistant coatings $30_A"$ and $30_B"$ may differ physically (e.g., in thickness, in surface texture, etc.) from each other. Some embodiments of moisture-resistant coatings $30_A"$ and $30_B"$ may have different chemical properties (e.g., include different materials, etc.) from one another. Other characteristics (e.g., transparency/opacity, thermal conductivity, etc.) may also distinguish moisture-resistant coatings $30_A"$ and $30_B"$ from each other. In any event, each moisture-resistant coating $30_A"$, $30_B"$ may completely line the surfaces that define the boundaries 23" of its respective internal space $22_A"$, $22_B"$ (see FIG. 1) or it may only line some of the surfaces, or portions of one or more of the surfaces, that define the boundaries 23" of its respective internal space $22_A"$, $22_B"$.

Moisture-resistant coatings $30_A"$ and $30_B"$ that differ from one another may cover different regions of an electronic device assembly (e.g., different components of an electronic device assembly, etc.), as illustrated by FIG. 3.

Figure 3A:
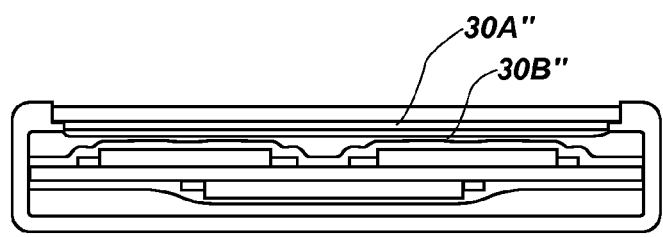

Alternatively, or in addition, as depicted by FIG. 3A, two or more moisture-resistant coatings $30_A"$ and $30_B"$ may be at least partially superimposed relative to one another to form a multi-layered moisture-resistant coating. The various layers of such a coating may be discrete from one another; i.e., there may be a discernible boundary between them. Alternatively, a transition region, or gradient, may exist between them. In a specific embodiment, a lower of the moisture-resistant coatings $30_A"$ may comprise a substantially confluent film (e.g., a polymer, such as a poly(p-xylylene) polymer; a ceramic material; etc.), while an outer moisture-resistant coating $30_B"$ may have moisture repellant properties (e.g., include so-called "lotus leaf" nanostructures, which are known to repel water and other aqueous materials; be formed from a moisture repellant material, such as a fluorinated polymer; etc.).

Figure 4:
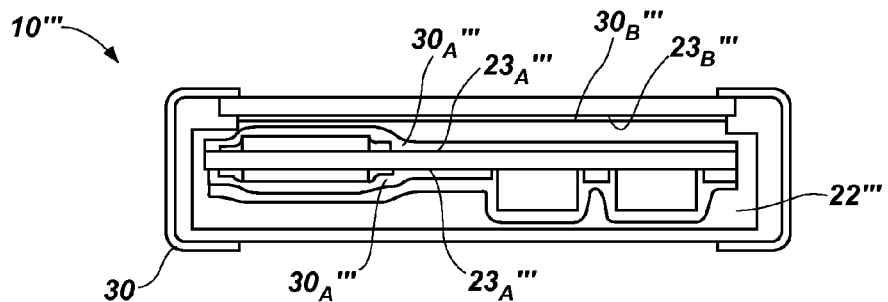

FIG. 4 illustrates an embodiment of electronic device 10''' in which different portions of the boundaries $23_A'''$ and $23_B'''$ of the at least one internal space 22''' are lined with different types of moisture-resistant coatings $30_A'''$ and $30_B'''$, respectively. In some embodiments the moisture-resistant coatings $30_A'''$ and $30_B'''$ may differ physically (e.g., in thickness, in surface texture, etc.) from each other. Some embodiments of moisture-resistant coatings $30_A'''$ and $30_B'''$ may have different chemical properties (e.g., include different materials, etc.) from one another. Other characteristics may also distinguish moisture-resistant coatings $30_A'''$ and $30_B'''$ from each other. In some embodiments of electronic devices 10''' that include different types of moisture-resistant coatings $30_A'''$ and $30_B'''$ at different locations, the boundaries $23_A'''$ and $23_B'''$ of an internal space 22''' of the electronic device 10''' may be completely lined with the moisture-resistant coatings $30_A'''$ and $30_B'''$, in a manner similar to that illustrated by FIG. 1. In other embodiments, the different types of moisture-resistant coatings $30_A'''$ and $30_B'''$ may, collectively, only line parts of the boundaries $23_A'''$ and $23_B'''$ of the internal space 22''', with at least some surfaces that define the boundaries $23_A'''$ and $23_B'''$ remaining uncoated, in a manner similar to that depicted by FIG. 2.

In some embodiments, such as that illustrated by FIG. 1, all of the moisture-resistant coatings 30 of an electronic device 10 may reside within its interior 21; none of the moisture-resistant coatings 30 of such an electronic device 10 are present on its exterior 11. Alternatively, as shown in FIG. 4, an electronic device 10''' may include one or more moisture-resistant coatings 30 that extend onto its exterior 11.

Figure 5:
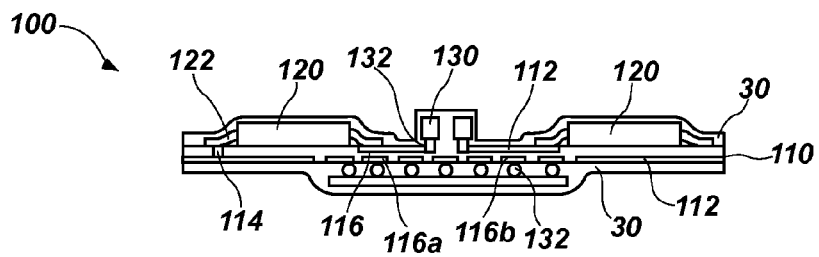
FIGS. 5 and 6 schematically illustrate embodiments of electronic assemblies with moisture-resistant coatings on at least some features thereof.
Figure 6:
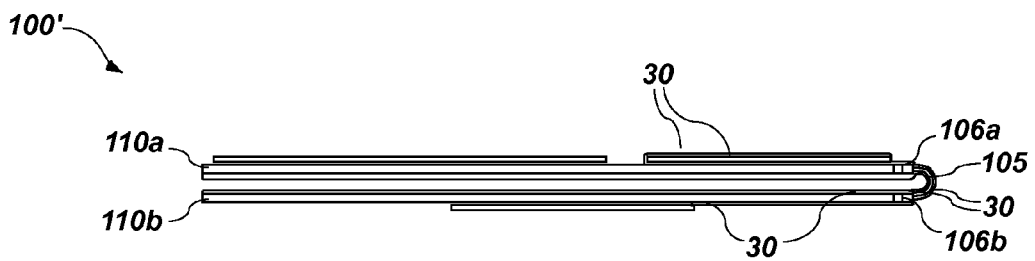

Turning now to FIGS. 5 and 6, specific features that may be covered and/or protected by a moisture-resistant coating 30 are shown.

FIGS. 5 and 6 illustrate moisture-resistant coatings 30 that cover a plurality of assembled electronic components. Specifically, the assembly 100 illustrated by FIG. 5 includes a circuit board 110, one or more semiconductor devices 120 and one or more discrete components 130 (e.g., resistors, capacitors, inductors, diodes, etc.), as well as a plurality of intermediate conductive elements 122, 132 (e.g., leads, solder structures, etc.). In some instances components 130 may be embedded in the circuit board 110.

The circuit board 110 includes a number of conductive traces 112, terminals 116 and, optionally, conductive vias 114. The conductive traces 112 and optional conductive vias 114 are configured to convey electrical signals from one terminal 116a to another terminal 116b (each terminal 116a, 116b may also, for the sake of simplicity, be referred to herein as a "terminal 116") of the circuit board 110. One or more of these electrically conductive features of the circuit board 110 may be electrically exposed.

Each semiconductor device 120 and/or discrete component 130 may be physically carried by the circuit board 110. An intermediate conductive element 122, 132 may electrically couple circuitry of each semiconductor device 120 and/or discrete component 130 (including, e.g., contact pads, leads, etc., as the case may be) to an appropriate terminal 116 of the circuit board 110.

In addition to the foregoing, the assembly 100 includes at least one moisture-resistant coating 30. The moisture-resistant coating 30 may cover any of the electrically conductive features of the assembly 100 (e.g., the intermediate conductive elements 122, 132; one or more conductive traces 112, conductive vias 114 and/or terminals 116 of the circuit board 110; one or more contact pads, leads, etc., of a semiconductor device 120 and/or discrete component 130; etc.). By covering an electrically conductive feature, the moisture-resistant coating 30 may prevent electrically conductive forms of moisture (e.g., water, aqueous solutions, water vapor, vapor of an aqueous solution, an electrically conductive organic liquid or vapor, etc.) from providing a conductive path between that electrically conductive feature and any other electrically conductive feature of the assembly 100.

As shown, in addition to covering one or more electrically conductive features of the assembly 100, the moisture-resistant coating 30 may extend onto other features that are adjacent to the electrically conductive features. By way of example, and not by way of limitation, as FIG. 5 further illustrates, the moisture-resistant coating 30 may extend over a portion of the circuit board 110, a semiconductor device 120 on the circuit board 110 and/or any discrete components 130 on the circuit board 110. In some embodiments, the moisture-resistant coating 30 may substantially cover each semiconductor device 120 and discrete component 130 of the assembly, as well as portions of the circuit board 110 that are not covered by another device or that do not need to be exposed to enable further electrical coupling.

The assembly 100' shown in FIG. 6 includes at least two circuit boards 110a and 110b with an electrical connector 105 extending therebetween. The electrical connector 105 includes one or more conductive elements that enable electrical signals to be communicated from one of the circuit boards 110a, 110b to the other one of the circuit boards 110b, 110a. Although the electrical connector 105 is depicted as being a flex-type connector with a plurality of conductive elements, as will be apparent to those of ordinary skill in the art, other types and configurations of electrical connectors may be used to establish electrical communication between the circuit boards 110a and 110b. Each of the circuit board 110a, the electrical connector 105, the circuit board 110b and junctions 106a, 106b between the electrical connector 105 and each of the circuit boards 110a, 110b may be at least partially covered with one or more moisture-resistant coatings 30.

Figure 7:
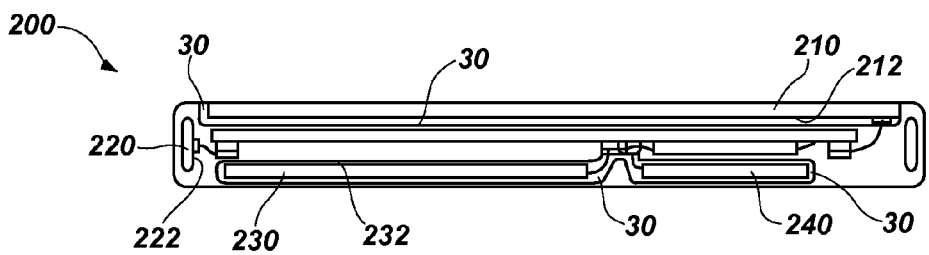
FIG. 7 depicts an embodiment of an electronic device in which various components, including a display, a power source and a radiofrequency (RF) device, are at least partially covered with moisture-resistant coatings.

FIG. 7 depicts an embodiment of electronic device 200 (e.g., a portable electronic device, such as a mobile telephone or a smart phone; a mobile computing device, such as a tablet computer, a portable digital assistant; another electronic device that wirelessly receives and/or transmits signals; an electronic device that is expected to be used in an environment where exposure to moisture is likely or even expected; or any other electronic device) that includes a number of components with internal surfaces that are at least partially covered with moisture-resistant coatings 30. As illustrated, internal surfaces 212, 222 and 232 of, and, optionally, electrical connections to and from, a display 210, a radiofrequency (RF) device 220 (e.g., one or more antennas, etc.), and a power source 230 (e.g., a battery, supercapacitor, fuel cell, etc.), respectively, of the electronic device 200 may be at least partially, or even completely, covered with a moisture-resistant coating 30. In embodiments where the electronic device 200 receives power wirelessly (e.g., by way of a wireless receiver, such as a receiver of an inductive charging system that communicates with the power supply 230, etc.) (including devices that lack externally accessible contacts for receiving communication cables or other wires, etc.), a surface of any component of the wireless power supply system 240 within the electronic device 200 and, optionally, any electrical connections between that component and the power supply 230, may be at least partially, or even completely (particularly since the wireless power supply system 240 lacks electrical contacts), covered with a moisture-resistant coating 30. Of course other features (e.g., stationary vibration devices, digital imaging devices, optical signals (e.g., light-emitting diode (LED) flashers), camera flashes, speakers, microphones, switches, ports, jacks, communication ports (e.g., USB connectors, specialized connectors, etc.), etc.) with an electronic device 200 may also be at least partially coated with moisture-resistant coatings 30.

The thickness of a moisture-resistant coating 30 may be sufficient to inhibit the passage of moisture through the moisture-resistant coating 30 to the elements that the moisture-resistant coating 30 is intended to protect. The thickness of the moisture-resistant coating 30 may be tailored to provide a specific degree of moisture resistance, or protection. In some embodiments, a moisture-resistant coating 30 may have a substantially uniform thickness across its entire area. Alternatively, the thickness of the moisture-resistant coating 30 may vary from location to location. A moisture-resistant coating 30 may include relatively thick regions located over features that are susceptible to damage from moisture of the type(s) against which the moisture-resistant coating 30 is configured to protect, as well as relatively thin regions located over features that are less susceptible to being damaged by that (those) type(s) of moisture.

Any of a variety of metrics may be used to quantify the moisture resistance of each coating formed by an assembly system. For example, the ability of a coating to physically inhibit one or more types of moisture from contacting a coated feature may be considered to impart the coating with moisture resistance. As another example, the moisture resistance of a coating may be based on more quantifiable data, such as the rate at which one or more types of moisture permeate through the coating. In embodiments where a coating is configured to limit the penetration of water or another aqueous material, the moisture resistance of that coating may be quantified in terms of its water vapor transfer rate. The water vapor transfer rate of a coating may be measured using known techniques in units of $g/m^2/day$ or in units of $g/100\ in^2/day$ (e.g., less than 2 $g/100\ in^2/day$, about 1.5 $g/100\ in^2/day$ or less, about 1 $g/100\ in^2/day$ or less, about 0.5 $g/100\ in^2/day$ or less, about 0.25 $g/100\ in^2/day$ or less, about 0.15 $g/100\ in^2/day$ or less, etc., through a film having an average thickness of about 1 mil (i.e., about 25.4 µm), at a temperature of 37° and at a relative humidity of 90%).

Another way in which the moisture resistance of a coating may be determined is by measuring the contact angle of liquid that has been applied to a surface of the coating by an acceptable technique (e.g., the static sessile drop method, the dynamic sessile drop method, etc.). Contact angles may be used to determine the ability of a coating to repel a certain type of moisture (e.g., due to the material from which the coating is made, due to the surface energy of the material from which the coating is made, due to a microstructure or nanostructure of a surface of the coating, etc.). In embodiments where a coating is configured to prevent exposure of one or more components of an electronic device to aqueous moisture, the hydrophobicity of the surface may be measured by determining the angle the base of a water droplet makes with the surface, from beneath a base of the water droplet; for example, using the Young equation, i.e.:

$$\theta_C = \arccos \frac{r_A \cos\theta_A + r_R \cos\theta_R}{r_A + r_R},$$

where $\theta_A$ is the highest, or advancing, contact angle; $\theta_R$ is the lowest, or receding, contact angle;

$$r_A = \sqrt[3]{\frac{\sin^3\theta_A}{2 - 3\cos\theta_A + \cos^3\theta_A}}\ ;\ \text{and}\ r_R = \sqrt[3]{\frac{\sin^3\theta_R}{2 - 3\cos\theta_R + \cos^3\theta_R}}.$$

If the surface is hydrophilic, the water will spread somewhat, forming a water contact angle of less than 90° with the surface. In contrast, a hydrophobic surface, which, for purposes of this disclosure, may be considered to be moisture resistant, will prevent the water from spreading, resulting in a water contact angle of 90° or greater. The more the water beads on a surface, the greater the water contact angle. When water droplets bead on a surface such that the water contact angle with the surface is about 120° or more, the surface is considered to be highly hydrophobic. When the angle at which water contacts a surface exceeds 150° (i.e., a water droplet on the surface is nearly spherical), the surface is said to be "superhydrophobic." Similar techniques may be used to determine the ability of a coating to repel or otherwise control exposure of one or more components of an electronic device to other types of moisture, such as liquid organic materials.

Moisture-resistant coatings formed of different types of parylene (e.g., parylene N, parylene C, etc.) and having thicknesses of from about one micron to about ten microns exhibit water contact angles of about 90° or more. More specifically, the water contact angles of these films ranged from 87° to 99°. Accordingly, these films may be referred to as "hydrophobic coatings."

Of course, other measures of moisture resistance may also be employed to determine the ability of a coating to resist moisture (e.g., by impermeability, repellency, etc.).

Any of a variety of suitable materials, techniques and apparatus may be used to apply a moisture-resistant coating 30 to at least a portion of a subassembly or an assembly of electronic components. Without limitation, a moisture-resistant coating 30 may be formed from reactive monomers, which monomers may then be deposited onto and form polymers on one or more surfaces that are to be made moisture resistant or moisture proof (e.g., waterproof, etc.). In specific embodiments, poly(p-xylylene) (i.e., Parylene), including unsubstituted and/or substituted units, may be deposited onto one or more surfaces that are to be rendered moisture resistant (e.g., water-resistant, waterproof, etc.). Examples of processes for forming parylene coatings are described by U.S. patent application Ser. Nos. 12/104,080, 12/104,152 and 12/988,103, the entire disclosure of each of which is, by this reference, hereby incorporated herein. U.S. patent application Ser. Nos. 12/446,999, 12/669,074and 12/740,119, the entire disclosures of all of which are, by this reference, hereby incorporated herein, disclose other embodiments of materials, techniques and equipment that may be used to form a moisture-resistant coating 30.

Other materials may also be used to form a moisture-resistant coating 30. Materials that may be used to form a moisture-resistant coating 30 include, but are certainly not limited to, organic materials, halogenated materials, ceramics (e.g., aluminum oxide, etc.) and other materials that may be applied to an electronic device assembly or a component thereof to provide a relatively thin moisture barrier. Non-limiting examples of organic materials include thermoplastic materials, curable materials (e.g., radiation-curable materials, one-part materials, two-part materials, thermoset materials, room-temperature curable materials, etc.). Some organic materials that are used to form moisture-resistant coatings 30 may be halogenated (e.g., fluorinated polymers, such as fluorinated silanes, etc.).

A variety of processes may be used to form the moisture-resistant coating 30. A process may be selected on the basis of its usefulness for applying a desired type of material to an electronic device assembly or a component thereof, and based on its compatibility with the component or the electronic device assembly to which the material is to be applied. Examples of processes for forming moisture-resistant coatings 30 include, without limitation, physical application processes (e.g., printing, spraying, dipping, rolling, brushing, etc.), chemical vapor deposition (CVD), plasma-based coating processes, atomic layer deposition (ALD), physical vapor deposition (PVD) (e.g., evaporation deposition processes (including, but not limited to e-beam evaporation, sputtering, laser ablation, pulsed laser deposition, etc.), vacuum deposition processes, sputtering, etc.). Of course, other techniques may also be used to form a moisture-resistant coating 30.

With returned reference to FIGS. 1 through 4, the absence of a moisture-resistant coating 30; $30_A''$, $30_B''$; $30_A'''$, $30_B'''$ on any portion of the boundaries 23, 23', 23", 23'" of an internal space 22, 22', 22", 22'" or the presence of different types of moisture-resistant coatings $30_A''$ and $30_B''$, $30_A'''$ and $30_B'''$ on different internal surfaces in the same electronic device 10, 10', 10", 10'", 100, 200 may be achieved by separately coating different components and/or subassemblies of the electronic device 10, 10', 10", 10'", 100, 200 before assembling those components and/or subassemblies with one another.

Although the foregoing description contains many specifics, these should not be construed as limiting the scope of any of the appended claims, but merely as providing information pertinent to some specific embodiments that may fall within the scopes of the appended claims. Features from different embodiments may be employed in combination. In addition, other embodiments of the disclosed subject matter may also be devised which lie within the scopes of the appended claims. The scope of each claim is, therefore, indicated and limited only by its plain language and the legal equivalents to each of its elements. All additions, deletions and modifications to the disclosed subject matter that fall within the meanings and scopes of the claims are to be embraced by the claims.

What is claimed:

1. An electronic device, comprising:
    a housing comprising an interior surface that defines an interior cavity;
    a substrate within the interior cavity, the substrate having a first substrate surface and a second substrate surface opposite to the first substrate surface:
    at least one component of the electronic device within the interior cavity formed on the first substrate surface of the substrate, the at least one component having a first surface;
    a first water-resistant film formed directly on the interior surface of the housing; and
    a second water-resistant film separated from the first water-resistant film and formed directly on the first surface of the at least one component,
    wherein an empty void is defined between the first water-resistant film and the second water-resistant film.

2. The electronic device of claim 1, wherein the first water-resistant film and the second water-resistant film have different chemical properties.

3. The electronic device of claim 1, wherein at least one discernible boundary separates the first water-resistant film from the second water-resistant film, the at least one discernible boundary located wholly between the interior surface of the housing and the first surface of the at least one component.

* * * * *